(12) United States Patent
Koshimura et al.

(10) Patent No.: US 8,587,778 B2
(45) Date of Patent: Nov. 19, 2013

(54) LIGHT IRRADIATION APPARATUS, COMPONENT IMAGE PICKUP APPARATUS, AND COMPONENT MOUNTING APPARATUS

(75) Inventors: Akira Koshimura, Saitama (JP); Koya Nomoto, Saitama (JP); Kazuhito Kunishima, Saitama (JP); Daisuke Tanaka, Chiba (JP)

(73) Assignee: Sony Corporation, Tokyo (JP)

( * ) Notice: Subject to any disclaimer, the term of this patent is extended or adjusted under 35 U.S.C. 154(b) by 251 days.

(21) Appl. No.: 13/227,827

(22) Filed: Sep. 8, 2011

(65) Prior Publication Data

US 2012/0062878 A1 Mar. 15, 2012

(30) Foreign Application Priority Data

Sep. 15, 2010 (JP) ................................. 2010-206505

(51) Int. Cl.
*G01N 21/01* (2006.01)

(52) U.S. Cl.
USPC ............................ 356/244; 382/145; 382/151

(58) Field of Classification Search
USPC ........................................................ 356/244
See application file for complete search history.

(56) References Cited

U.S. PATENT DOCUMENTS

| | | | | |
|---|---|---|---|---|
| 5,131,139 A * | 7/1992 | Oyama et al. | .................... | 29/721 |
| 5,224,262 A * | 7/1993 | Takaichi et al. | ................. | 29/721 |
| 5,461,480 A * | 10/1995 | Yamada et al. | ............... | 356/394 |
| 5,923,772 A * | 7/1999 | Fukuda et al. | ................ | 382/141 |
| 5,991,039 A * | 11/1999 | Fujishiro et al. | ................ | 356/614 |
| 5,999,640 A * | 12/1999 | Hatase et al. | ................. | 382/151 |
| 6,211,958 B1 * | 4/2001 | Hachiya et al. | ............... | 382/151 |
| 6,285,782 B1 * | 9/2001 | Inoue et al. | .................... | 382/145 |
| 6,496,272 B1 * | 12/2002 | Watanabe | ..................... | 356/614 |
| 7,089,656 B2 * | 8/2006 | Nagao et al. | .................... | 29/740 |

FOREIGN PATENT DOCUMENTS

| | | | |
|---|---|---|---|
| JP | 07221498 | * | 8/1995 |
| JP | 09-321494 | | 12/1997 |
| JP | 2001-077594 | | 3/2001 |

* cited by examiner

*Primary Examiner* — Roy M Punnoose
(74) *Attorney, Agent, or Firm* — Dentons US LLP

(57) ABSTRACT

A light irradiation apparatus capable of irradiating, while a component having a first side is held on the first side by a holding body of a component mounting apparatus, light onto a reflective plate to irradiate reflected light from the reflective plate from the first side of the component, the light irradiation apparatus including: a plurality of first light-emitting devices; a supporting body configured to support the plurality of first light-emitting devices such that optical-axis directions of the plurality of first light-emitting devices match; and a light guide body configured to guide light emitted from the plurality of first light-emitting devices to the reflective plate so that the reflected light is detected by a detector from a second side of the component on the other side of the first side.

12 Claims, 9 Drawing Sheets

LIGHT IRRADIATION APPARATUS, COMPONENT IMAGE PICKUP APPARATUS, AND COMPONENT MOUNTING APPARATUS

BACKGROUND

The present disclosure relates to a component image pickup apparatus that picks up an image with a camera for recognizing, for example, a shape of components such as an electronic component, a light irradiation apparatus used in the component image pickup apparatus, and a component mounting apparatus that is equipped with the component image pickup apparatus and the light irradiation apparatus and mounts the components on a substrate.

As a light irradiation apparatus for a camera that is equipped in a component mounting apparatus such as a surface mounting apparatus, an illumination apparatus for improving a component recognition accuracy without being influenced by a type of component is disclosed in Japanese Patent Application Laid-open No. Hei 9-321494 (hereinafter, referred to as Patent Document 1) and Japanese Patent Application Laid-open No. 2001-77594 (hereinafter, referred to as Patent Document 2).

In a surface mounting apparatus of Patent Document 1, an image pickup unit that picks up an image of a component sucked by a nozzle is provided. The image pickup unit includes a backlight unit provided around the nozzle, a component recognition camera, a plurality of LEDs (Light Emitting Diodes) constituting a fore light provided around the component recognition camera, and a frame to which the component recognition camera and the plurality of LEDs are attached integrally. Light from the backlight is irradiated onto a component from a back side so that an outline of the component is easily detected by the component recognition camera. On the other hand, light from the LEDs is dispersed hemispherically and directly irradiated onto the component so that the reflected light from the component is detected. Since the fore light and backlight operate selectively according to the type of components, the component recognition camera is capable of recognizing a shape of the component and the like irrespective of its type (see, for example, paragraphs [0036], [0037], and [0041] in specification and FIG. 6 of Patent Document 1).

It should be noted that in a component recognition device disclosed in Patent Document 2, a light irradiation unit corresponding to the backlight and fore light in the technique of Patent Document 1 is provided. In particular, in Patent Document 2, a conic reflective plate (nozzle back plate) is attached to a sucking nozzle that sucks components, and light from a first light source constituted of a plurality of LEDs provided on a lower side is irradiated onto the nozzle back plate so that the reflected light from the nozzle back plate becomes the backlight (see, for example, paragraphs [0020] and [0024] in specification and FIG. 3 etc. of Patent Document 2).

SUMMARY

The LEDs of the image pickup unit of Patent Document 1 are each a cannonball-type LED and arranged such that optical-axis directions thereof coincide with a direction toward a component. For enhancing a recognition accuracy of a camera on shapes of components, an attachment accuracy that takes the optical-axis directions into account becomes important. Specifically, when assembling the image pickup unit, an operator attaches leads of the cannonball-type LEDs to an attachment body (print substrate) by inserting them by a manual task and adjusts the optical-axis directions of the cannonball-type LEDs one by one. Therefore, there has been a problem that a considerable amount of time and effort as well as costs are required for the assemble.

In view of the circumstances as described above, there is a need for a light irradiation apparatus capable of saving time and effort in attaching light-emitting devices to a supporting body, a component image pickup apparatus equipped with the light irradiation apparatus, and a component mounting apparatus equipped with the component image pickup apparatus.

According to an embodiment of the present disclosure, there is provided a light irradiation apparatus capable of irradiating, while a component having a first side is held on the first side by a holding body of a component mounting apparatus, light onto a reflective plate to irradiate reflected light from the reflective plate from the first side of the component.

The light irradiation apparatus includes a plurality of first light-emitting devices, a supporting body, and a light guide body.

The supporting body is configured to support the plurality of first light-emitting devices such that optical-axis directions of the plurality of first light-emitting devices match.

The light guide body is configured to guide light emitted from the plurality of first light-emitting devices to the reflective plate so that the reflected light is detected by a detector from a second side of the component on the other side of the first side.

Since the plurality of first light-emitting devices are supported by the supporting body such that the optical-axis directions thereof match, there is no need to attach the light-emitting devices to an attachment target while changing optical-axis directions thereof as in the related art. Therefore, time and effort in attaching the first light-emitting devices to the supporting body can be lessened dramatically. Since the optical-axis directions match, by providing the light guide body, light can be guided to the reflective plate irrespective of the arrangement of the first light-emitting devices.

The expression "match" means "practically match". The expression "practically" means that the detector is capable of detecting image light of components using light emitted from the plurality of first light-emitting devices supported by the supporting body via the light guide body so that a computer can recognize shapes of components and the like.

The light irradiation apparatus may further include a plurality of second light-emitting devices supported by the supporting body such that optical-axis directions thereof match. In this case, the light guide body guides light emitted from the plurality of second light-emitting devices to at least the second side of the component. Since the plurality of second light-emitting devices are also supported by the supporting body such that the optical-axis directions thereof match, time and effort in attaching the second light-emitting devices to the supporting body can also be lessened dramatically.

The supporting body may be a common substrate that supports the plurality of first light-emitting devices and the plurality of second light-emitting devices such that the optical-axis directions of the plurality of first light-emitting devices and the optical-axis directions of the plurality of second light-emitting devices match. With this structure, the light irradiation apparatus can be thinned and incorporated into an existing component mounting apparatus. Moreover, since the supporting body is a substrate, the first and second light-emitting devices can be automatically attached by the mounting apparatus, with the result that productivity can be improved and production costs of the light irradiation apparatus can be cut.

The light guide body may include a light incident surface, a first reflective surface, a light-emitting surface, an internal area, and a second reflective surface.

The light from the plurality of first light-emitting devices enters the light incident surface. The first reflective surface reflects the light that has entered the light incident surface. The light reflected by the first reflective surface exits the light-emitting surface. Through the internal area, light passes between the light incident surface and the light-emitting surface. The second reflective surface is provided on an outer surface of the light guide body and configured to reflect the light from the plurality of second light-emitting devices to guide the reflective light to at least the second side of the component. Since the light guide body includes the first reflective surface that reflects light within the internal area of a single light guide body and the second reflective surface provided on the outer surface of the light guide body, two different optical paths can be formed by a single light guide body.

The light from the plurality of first light-emitting devices may enter the light guide body to cause a total reflection by the first reflective surface. With this structure, there is no substantive loss in the light amount unlike a case where a reflective film is formed in the light guide body as the first reflective surface, for example.

The plurality of first light-emitting devices may be arranged along a first circumference. In this case, the plurality of second light-emitting devices are arranged along a second circumference on an inner side of the first circumference. In addition, the light guide body has a ring shape formed along the arrangements of the plurality of first light-emitting devices and the plurality of second light-emitting devices. With this structure, since the light from the first and second light-emitting devices is uniformly irradiated onto the components, image light of the components can be detected highly accurately by the detector, with the result that a component recognition accuracy is improved. Moreover, the holding body and the reflective plate can be positioned on an axis set in the axial direction that passes a center of the ring shape. The detector can also be set on the same axis.

The plurality of first light-emitting devices and the plurality of second light-emitting devices may emit light having different wavelength ranges. With this structure, image light of the components can be detected highly accurately by the detector, with the result that a component recognition accuracy is improved.

The plurality of first light-emitting devices may be arranged along a circumference. In this case, the light guide body has a ring shape formed along the arrangement of the plurality of first light-emitting devices. With this structure, since the light from the first light-emitting devices is uniformly irradiated onto the components, image light of the components can be detected highly accurately by the detector, with the result that a component recognition accuracy is improved. Moreover, the holding body and the reflective plate can be positioned on an axis set in the axial direction that passes a center of the ring shape. The detector can also be set on the same axis.

The plurality of first light-emitting devices may be arranged along a part of a circumference. In this case, the light guide body has a partial ring shape formed along the arrangement of the plurality of first light-emitting devices. With this structure, it is possible to prevent the light irradiation apparatus from interfering with other members of the component mounting apparatus when mounting the light irradiation apparatus on the component mounting apparatus.

The light irradiation apparatus may further include a plurality of third light-emitting devices provided such that optical-axis directions thereof match. The plurality of first light-emitting devices may be arranged along a part of a circumference. In this case, the plurality of third light-emitting devices are arranged in an area excluding the part of the circumference. In addition, the supporting body is a flexible print substrate including a first supporting portion that supports the plurality of first light-emitting devices and a second supporting portion that is bent from the first supporting portion and supports the plurality of third light-emitting devices. With this structure, the first and third light-emitting devices can be attached to a single flexible print substrate. By bending the flexible print substrate, the first and third light-emitting devices can be set easily.

According to an embodiment of the present disclosure, there is provided a component image pickup apparatus including a reflective plate, a plurality of first light-emitting devices, a supporting body, a light guide body, and a detector.

The supporting body is configured to support the plurality of first light-emitting devices such that optical-axis directions of the plurality of first light-emitting devices match.

The light guide body is configured to guide, while a component having a first side is held on the first side by a holding body of a component mounting apparatus, light emitted from the plurality of first light-emitting devices to the reflective plate so that the reflected light from the reflective plate is irradiated from the first side of the component held by the holding body.

The detector is configured to detect the reflected light from the reflective plate from a second side of the component on the other side of the first side.

According to an embodiment of the present disclosure, there is provided a component mounting apparatus including a holding body configured to hold a component having a first side on the first side and the component image pickup apparatus described above.

As described above, according to the embodiments of the present disclosure, time and effort in attaching the light-emitting devices to the supporting body can be lessened.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings.
<First Embodiment>

Figure 1:
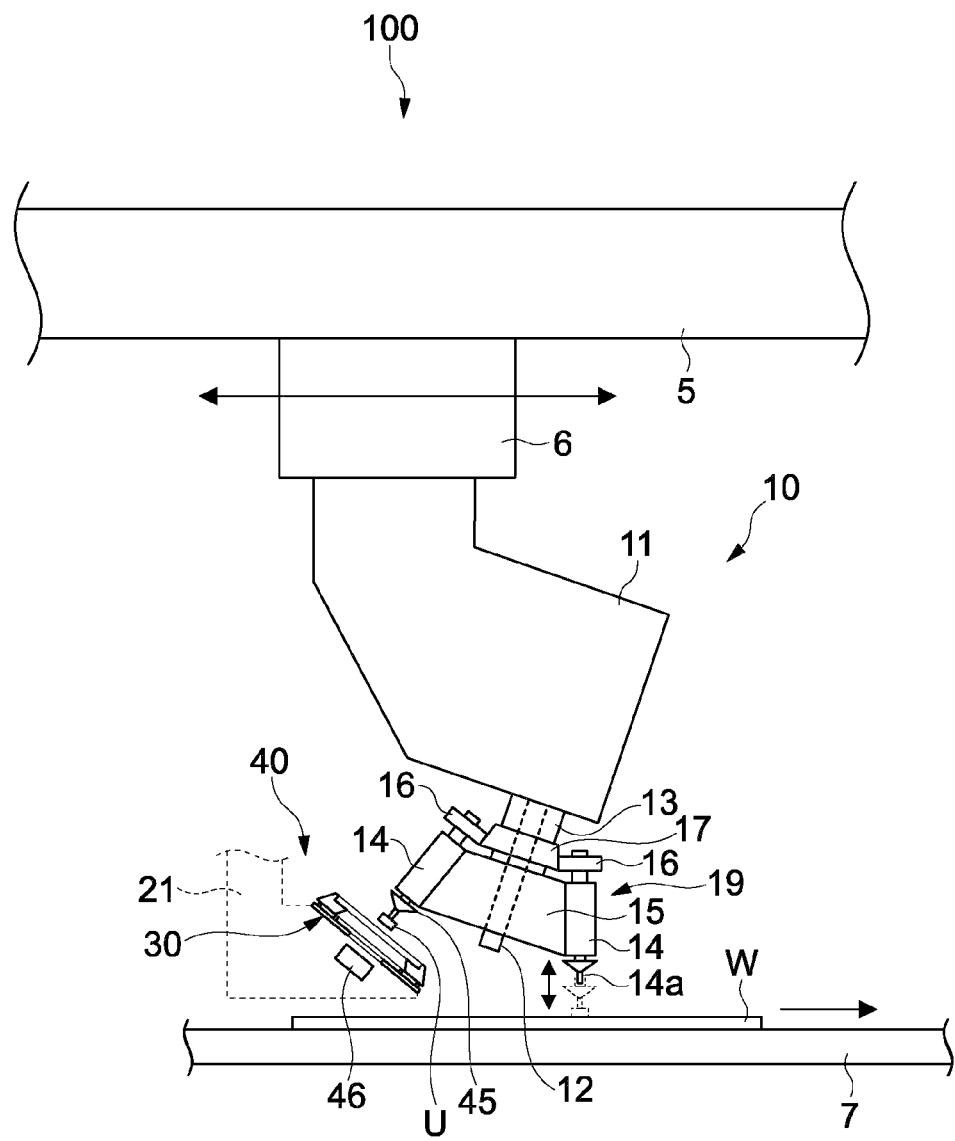
FIG. 1 is a diagram schematically showing a main portion of a component mounting apparatus according to an embodiment of the present disclosure.

FIG. 1 is a diagram schematically showing a main portion of a component mounting apparatus according to an embodiment of the present disclosure.

A component mounting apparatus 100 includes a mounting head 10, an X beam 5 extending in an X-axis direction, and a Y beam 6 extending in a Y-axis direction. The Y beam 6 is equipped with a Y-axis movement mechanism (not shown) that moves the mounting head 10 in the Y-axis direction. The Y-axis movement mechanism supports the hanging mounting head 10. Further, the X beam 5 is equipped with an X-axis movement mechanism (not shown) that moves the Y beam 6 and the Y-axis movement mechanism in the X-axis direction.

As a mechanism that realizes each of the X-axis movement mechanism and the Y-axis movement mechanism, a ball screw driving mechanism is used, for example. However, the mechanism is not limited thereto, and a belt driving mechanism or a linear motor driving mechanism may be used instead.

The mounting head 10 accesses a component supplying apparatus such as a tape carrier (not shown) to extract and hold an electronic component U and mounts the electronic component U on a mounting substrate W that is mounted on a conveyor 7 and on which the electronic component U is to be mounted. The electronic component U is a resistor, a capacitor, an IC package, or the like. Hereinafter, the electronic component will simply be referred to as component. The conveyor 7 conveys the mounting substrate W in, for example, the X-axis direction, and stops it at a predetermined mounting position. Accordingly, the held component U is mounted on the mounting substrate W by an operation of the mounting head 10.

The component mounting apparatus 100 includes a component image pickup unit (component image pickup apparatus) 40 that picks up an image of the component U for recognizing its shape and the like. The component image pickup unit 40 will be described later.

The mounting head 10 includes a carriage portion 11 supported by the Y beam 6 and a turret portion 19 connected to the carriage portion 11. Incorporated inside the carriage portion 11 is a driving portion that drives the turret portion 19.

The turret portion 19 includes a turret head 15, a nozzle rotary shaft 13 extending from the carriage portion 11 in a downward oblique direction, and a turret head rotary shaft 12 that is provided coaxial with the nozzle rotary shaft 13 and connected to the turret head 15. Further, the turret portion 19 includes a plurality of nozzle units 14 as a holding body that are provided around the turret head 15 and hold the components U by sucking them in vacuum. The nozzle rotary shaft 13 and the turret head rotary shaft 12 are tilted a predetermined angle from a vertical direction. For example, 8 to 12 nozzle units 14 are provided at regular intervals around the nozzle rotary shaft 13. At a lower end portion of each of the nozzle units 14, a sucking nozzle 14a that can be moved vertically along the Z-axis direction by an actuator (not shown) is provided. By lowering the sucking nozzle 14a, the component U is mounted on the mounting substrate W.

The nozzle rotary shaft 13 causes the sucking nozzles 14a to rotate (spin) via a gear 17 provided in the nozzle rotary shaft 13, a gear 16 provided in each of the nozzle units 14, and the like.

The turret head rotary shaft 12 causes the turret head 15 to rotate (spin) to cause the nozzle units 14 to revolve about the turret head rotary shaft 12. A driving portion inside the carriage portion 11 rotationally drives the nozzle rotary shaft 13 and the turret head rotary shaft 12 independently. The driving portion is constituted of a motor, a decelerator, and the like.

The turret head 15 has a partial conic shape that widens downwardly, and the nozzle units 14 are provided on a tapered surface as an outer circumferential surface thereof. When the nozzle unit 14 selected for mounting mounts the component U on the mounting substrate W, the turret head 15 is rotated such that the nozzle unit 14 is positioned at a position at which a longitudinal direction of the sucking nozzle 14 is set in the vertical direction (Z-axis direction).

Before the nozzle unit 14 mounts the component U on the mounting substrate W, the component U held by the sucking nozzle 14a of the nozzle unit 14 is photographed by the component image pickup unit 40 at a position 180° apart from the mounting position as a rotational angle of the turret head 15. In other words, at the time the component U is photographed, the sucking nozzle 14a holding the component U is set at a position at which it is directed obliquely. As described above, the component image pickup unit 40 is positioned close to the mounting position of the component U with respect to the mounting substrate W.

Hereinafter, the position of the sucking nozzle 14a at the time the component U is mounted (sucking nozzle 14a on the right-hand side shown in FIG. 1) is referred to as 0° position. Further, a position 180° apart from the 0° position as a rotational angle of the turret head 15 is referred to as 180° position.

Figure 2:
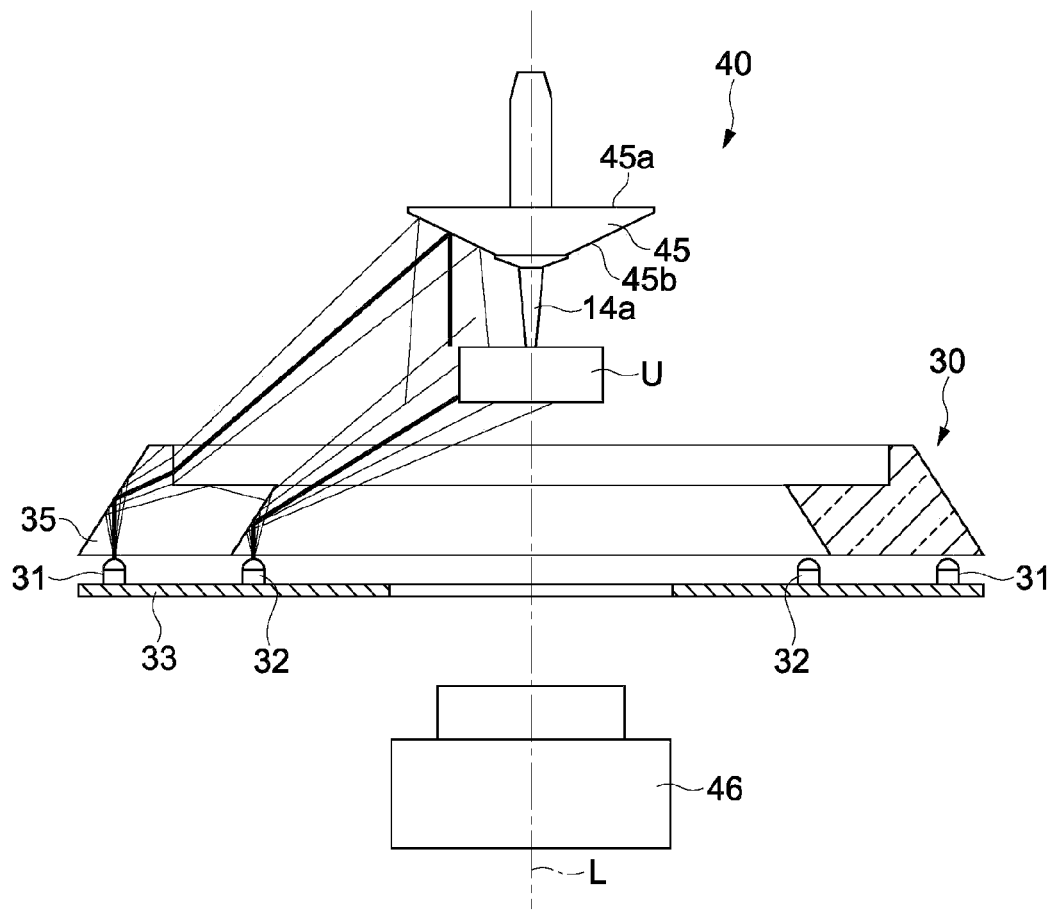
FIG. 2 is a side view schematically showing a component image pickup unit according to the embodiment.

FIG. 2 is a side view schematically showing the component image pickup unit 40 according to the embodiment.

The component image pickup unit 40 includes a conic reflective plate 45 provided in each nozzle unit 14 and a light irradiation unit (light irradiation apparatus) 30 that is provided below the conic reflective plate 45 and irradiates light onto the component U held by the sucking nozzle 14a using the conic reflective plate 45. The component image pickup unit 40 also includes a camera 46 that is provided below the light irradiation unit 30 and photographs the component U. The conic reflective plate 45 is integrally attached to the sucking nozzle 14a to be positioned around the sucking nozzle 14a.

The camera 46 includes an image pickup device such as a CCD (Charge Coupled Device) and a CMOS (Complementary Metal-Oxide Semiconductor) device.

The conic reflective plate 45 typically includes a surface formed of a resin having predetermined light reflection characteristics. The light reflection characteristics of the surface are adjusted by a color of a resin or surface roughness. It should be noted that the surface of the conic reflective plate 45 may be formed of, instead of a resin, aluminum, silver, or other metal films. Alternatively, the conic reflective plate 45 may entirely be formed of metal capable of reflecting light at a predetermined reflection ratio.

Figure 3:
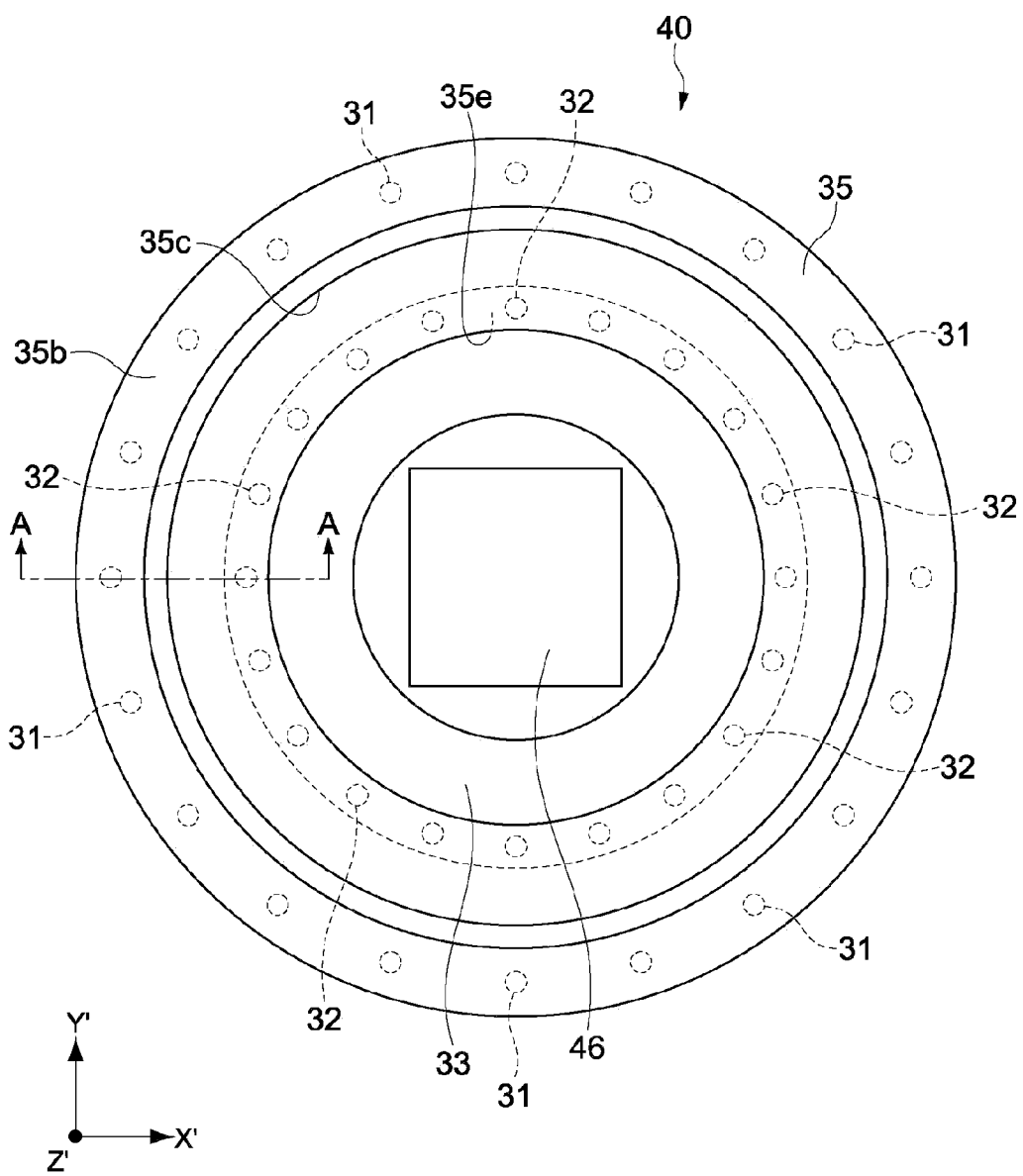
FIG. 3 is a plan view schematically showing a light irradiation unit mounted on the component image pickup unit.

FIG. 3 is a plan view of the light irradiation unit 30. The light irradiation unit 30 is supported by and fixed to a supporting table 21 in accordance with the tilt of the nozzle unit 14 as shown in FIG. 1. A tilt direction of the nozzle unit 14 (sucking nozzle 14a) is referred to as Z'-axis direction.

As shown in FIGS. 2 and 3, the light irradiation unit 30 includes a plurality of cannonball-type LEDs (first light-emitting devices) 31 that are arranged along a circumference (first circumference) and a plurality of cannonball-type LEDs (second light-emitting devices) 32 that are arranged along a circumference on an inner side of the LEDs 31 (second circumference). The light irradiation unit 30 includes a ring-type print substrate 33 as a supporting body that supports the LEDs 31 and 32. In other words, the supporting body is a single print substrate common to the LEDs 31 and 32.

The LEDs 31 emit green (wavelength range of about 480 to 580 nm) light, and the LEDs 32 emit red (wavelength range of about 600 to 760 nm) light. As will be described later, for the LEDs 31 to function as a backlight and recognize outer shapes of the components U, greenish to bluish light is used for enhancing a contrast of black. Red light is used for the LEDs 32 to function as a reflected illumination and recognize outlines of the components U by shades caused by unevenness of the surface of the components U.

The LEDs 31 and 32 are attached to the print substrate 33 such that all of the optical-axis directions practically match. Therefore, in this embodiment, there is no need to attach the LEDs to an attachment target while changing an optical-axis direction for each LED as in the related art. As a result, time and effort in attaching the LEDs 31 and 32 to the print substrate 33 can be lessened dramatically. For example, since the LEDs 31 and 32 can be mounted on the print substrate 33 by a mounting apparatus, productivity can be improved and costs can be cut significantly.

In descriptions below, as long as the LEDs 31 and 32 are not mentioned distinguishably, the LEDs 31 and 32 will be described as a single light source.

As described above, even when the optical-axis directions of all the LEDs 31 and 32 match, by providing a light guide body 35 described below, light from the light source can be irradiated onto the component U held by the sucking nozzle 14a at an appropriate angle.

The light irradiation unit 30 includes the light guide body 35 that guides light emitted from the light source to the component U. The light guide body 35 has a ring shape corresponding to the arrangements of the LEDs 31 and 32 and formed above the LEDs 31 and 32. The light guide body 35 is typically formed of PMMA (acryl), but may be formed of glass or a transparent resin other than acryl.

The light guide body 35, the conic reflective plate 45, and the light source are designed and set so as to satisfy the following conditions. Light emitted from the LEDs 31 is guided to the conic reflective plate 45 by the light guide body 35 and reflected by the conic reflective plate 45 so that the reflected light is irradiated onto the component U held by the sucking nozzle 14a from the back side (first side). In addition, light emitted from the LEDs 32 is irradiated onto the component U held by the sucking nozzle 14a from at least the front side (second side on the other side of back side) by the light guide body 35. In the case of this embodiment, the component U practically has a cuboid shape, and light from the LEDs 32 is also irradiated from the sides of the component U as shown in FIG. 2 depending on the size of the component U.

Specifically, light from the LEDs 31 functions as a backlight for detecting an outer shape of the component U using the camera 46. Light from the LEDs 32 functions as a reflected illumination for detecting at least a state of a surface (surface shape, material, etc.) on a front side of the component U.

The sucking nozzles 14a are each provided at substantially the center of each of the arrangements of the LEDs 31 and 32 and the ring-type light guide body 35 in a plane as shown in FIG. 3.

The position of the camera 46 is typically set as follows. The camera 46 is supported by the supporting table 21 such that an axis that is substantially vertical to (parallel to Z'-axis direction) the image pickup device of the camera 46 and passes the center thereof coincides with the longitudinal direction of the sucking nozzle 14a. Hereinafter, this axis will be referred to as camera optical axis L. Moreover, as shown in FIG. 2, an angle of a tapered surface 45b from an upper surface 45a (other side of side on which sucking nozzle 14a is provided) of the conic reflective plate 45 (taper angle) is designed such that an optical axis of reflected light of the light from the LEDs 31 reflected by the conic reflective plate 45 becomes substantially parallel to the camera optical axis L. However, the optical axis of the reflected light from the conic reflective plate 45 does not always need to be parallel to the camera optical axis L and only needs to be within a range in which the component U can be photographed appropriately by the camera 46 (referred to as effective image pickup range for convenience) as will be described later.

Figure 4:
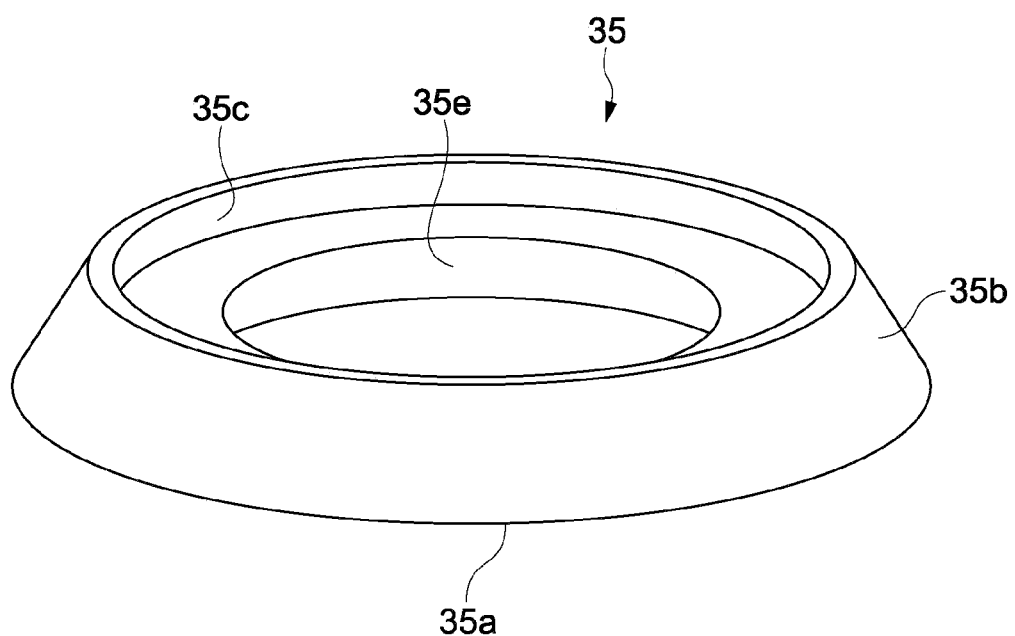
FIG. 4 is a perspective view showing a light guide body of the light irradiation unit.
Figure 5:
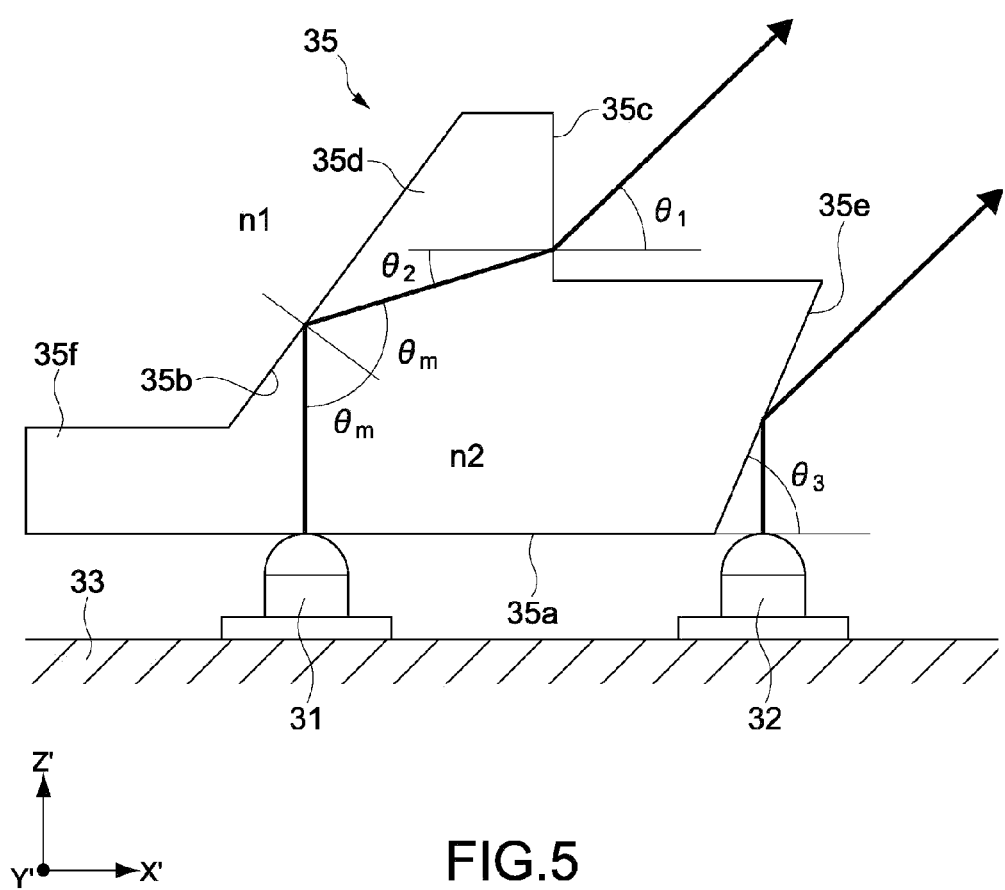
FIG. 5 is a cross-sectional diagram taken along the line A-A of FIG. 3.

FIG. 4 is a perspective view showing the light guide body 35, and FIG. 5 is a cross-sectional diagram taken along the line A-A of FIG. 3.

The light guide body 35 includes a light incident surface 35a that the light from the LEDs 31 enters, a first reflective surface 35b that reflects the entered light, a light-emitting surface 35c that the light reflected by the first reflective surface 35b exits, and an internal area 35d through which light passes between the light incident surface 35a and the light-emitting surface 35c. The light guide body 35 also includes a second reflective surface 35e that is an inner circumferential surface of the outer or front surface and reflects light from the LEDs 32 to directly guide it to the component U.

It should be noted that a protrusion 35f protruding from an outer circumferential portion of the light guide body 35 in FIG. 5 is not provided in the light guide body 35 shown in FIGS. 2 to 4. The protrusion 35f only needs to function as a portion for fixing the light guide body 35 and the print substrate 33 using a fixing tool such as a screw and a frame. Alternatively, the light guide body 35 and the print substrate 33 may be fixed by being bonded to each other using an adhesive or the like.

An incident angle of the light from the LEDs 31 with respect to the light incident surface 35a is substantially 0°. The light-emitting surface 35c is formed to be substantially parallel to the optical-axis direction of the light from the LEDs 31, for example. The first reflective surface 35b reflects the incident light from the light incident surface 35a at a critical angle of θm or more, that is, causes a total reflection, and causes the reflected light to exit the light-emitting surface 35c and enter the conic reflective plate 45 at a predetermined incident angle.

Since a total reflection is caused by the first reflective surface 35b as described above, there is no loss of a light amount unlike a case where the first reflective surface 35b is formed in the light guide body 35 as a reflective film, for example.

In general, at a time light enters a medium 1 having a small refractive index from a medium 2 having a large refractive index, a total reflection occurs when the incident angle is a critical angle or more. The critical angle $\theta m$ can be expressed by the following equation using a Snell's law.

$$\sin \theta m = n1/n2$$

n1 and n2 represent refractive indices of the media 1 and 2, respectively, and n1<n2 is satisfied.

In this embodiment, when the medium 1 is air (n1=1.0) and the medium 2 is PMMA (n2=1.49), the critical angle θm is as follows.

$$\sin θm=1.0/1.49$$

In this case, θm is equal to 42.2°.

The incident angle with respect to the first reflective surface 35b is set so as to become larger than the critical angle θm.

An incident angle θ2 with respect to the light-emitting surface 35c exits as it is without causing a total reflection since it is smaller than the critical angle θm. The emission angle θ1 at this time can be represented by the relationship of n1 sin θ1=n2 sin θ2 (n1<n2) also using the Snell's law.

The light emitted from the light-emitting surface 35c of the light guide body 35 is reflected by the conic reflective plate 45 in a direction along the camera optical axis L as described above and irradiated onto the component U from the back side thereof. The incident angle with respect to the conic reflective plate 45 is adjusted to an arbitrary angle by the light incident surface 35a, first reflective surface 35b, or light-emitting surface 35c of the light guide body 35 or the taper angle of the conic reflective plate 45 described above.

It should be noted that devices having a narrow diffusion angle of emission light (light distribution characteristics) are used for the LEDs 31 and 32. The diffusion angle is 20° to 40°, typically 25°.

Typically, when the taper angle of the conic reflective plate 45 is 30°, the light guide body 35 is designed and arranged such that the incident angle of the light emitted from the light guide body 35 with respect to the conic reflective plate 45 becomes about 50°.

Figure 6:
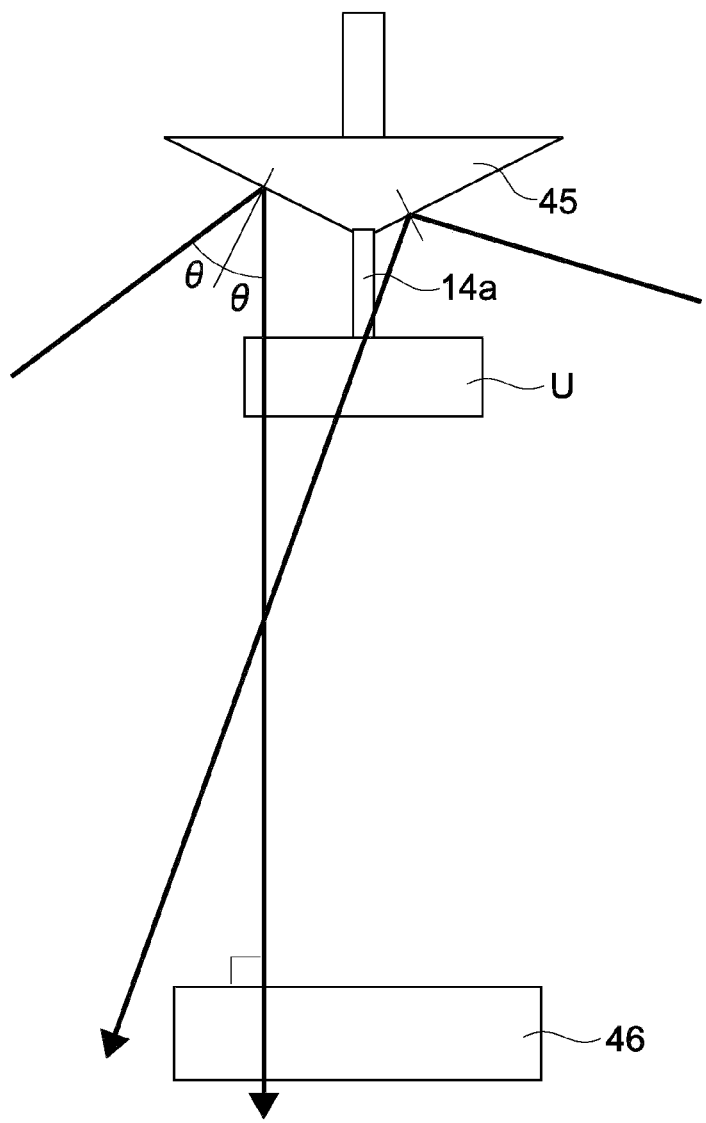
FIG. 6 is a diagram showing optical paths from a conic reflective plate to a camera.

The effective range of the incident angle with respect to the conic reflective plate 45 only needs to be an angle range in which reflected light from the conic reflective plate 45 is capable of entering the image pickup device from a lens (not shown) provided in the camera 46, that is, a range satisfying the effective image pickup range described above. As shown in FIG. 6, an optical amount loss is caused regarding the incident light with respect to the camera 46 exceeding the effective image pickup range, thus resulting in poor efficiency. As a parameter in this case, there are a directivity angle of the LEDs 31, surface characteristics of the light guide body 35, surface characteristics of the conic reflective plate 45, and the like. By optimizing these parameters, necessary irradiation range can be set.

The second reflective surface 35e of the light guide body 35 is constituted of, for example, a metal film. An angle θ3 of the second reflective surface 35e with respect to the light incident surface 35a only needs to be an angle with which light is irradiated on at least the front side of the component U. The first reflective surface 35b and the second reflective surface 35e may of course be either parallel or nonparallel to each other.

A recognition operation of the component U by the component image pickup unit 40 structured as described above will be described.

The mounting head 10 accesses a component supplying apparatus (not shown), and the sucking nozzle 14a extracts a component U from the component supplying apparatus. Typically, the turret head 15 is rotated so that the plurality of sucking nozzles 14a consecutively extract the components U. Upon extracting the components U, the mounting head 10 is moved to a position for mounting the components U on the mounting substrate W (e.g., position of mounting head 10 shown in FIG. 1) by the X-axis movement mechanism and Y-axis movement mechanism described above.

The component U that is an image pickup target of the component image pickup unit 40 and held by one sucking nozzle 14a of the mounting head 10 as shown in FIG. 1 is set at the 180° position. At the 180° position, the shape and surface state of the component U is photographed by the camera 46 using light from the light source. The photographed image is subjected to image processing by a computer so that the component U is recognized. Accordingly, whether there are an error regarding a type of component U to be mounted, a size error, an error of a holding position of the component U held by the sucking nozzles 14a, and the like is checked.

As described above, the LEDs 31 and 32 are attached to the print substrate 33 such that all of the optical-axis directions thereof match. Therefore, in this embodiment, there is no need to attach the LEDs to the attachment target while changing the optical-axis direction for each LED as in the related art, with the result that time and effort in attaching the LEDs 31 and 32 to the print substrate 33 can be lessened.

Further, a large number of components such as a screw have been required for setting the LEDs in the related art. However, according to this embodiment, since screws and an insulation cover become unnecessary, the number of components can be reduced.

The supporting body supporting the LEDs 31 and 32 is the print substrate 33 that is common to and integrally supports both the LEDs 31 and 32. With this structure, the light irradiation unit 30 can be thinned and incorporated into an existing component mounting apparatus 100. As shown in FIG. 1, a space between the sucking nozzle 14a set at the 180° position and the mounting substrate W set at the mounting position is thin and narrow. For setting the light irradiation unit 30 in such a thin and narrow space without causing an interference with other members, a thin substrate-type supporting body is favorable as the supporting body of the LEDs 31 and 32.

As described above, a distance that the sucking nozzle 14a holding the component U at the 0° position moves vertically becomes longer as a distance between the mounting substrate W and the sucking nozzles 14a set at the 0° position and the 180° position, that is, a distance between the mounting substrate W and the turret head 15 becomes longer. As a result, there arises a problem that tact becomes long. For shortening the tact, the distance needs to be made as short as possible. In view of such circumstances, the merit of using a substrate-type supporting body for the supporting body of the LEDs 31 and 32 is large.

Further, in this embodiment, for shortening the distance that the sucking nozzle 14a moves vertically as much as possible, the light guide body 35 is also designed to have a small thickness in the Z'-axis direction. This point will be described later.

Furthermore, since the light guide body 35 of this embodiment has the first reflective surface 35b and the second reflective surface 35e, two different optical paths of the LEDs 31 and 32 can be formed with a single light guide body 35. Particularly since the light from the LEDs 32 is reflected by the second reflective surface 35e formed on the inner circumferential surface of the light guide body 35, a high refractive index of light of the LEDs 32 can be realized while maintaining space saving with a single light guide body 35.

In this embodiment, the LEDs 31 and 32 are arranged along the circumference, and the light guide body 35 is formed in a ring shape so as to correspond to the annular arrangements. With such a structure, since the light from the LEDs 31 and 32 is uniformly irradiated onto the component U, image light of the component U by the camera 46 can be detected highly accurately, with the result that a recognition accuracy of the component U is improved.

Since the wavelength ranges of light from the LEDs 31 and 32 differ based on functions in this embodiment, image light of the component U by the camera 46 can be detected highly accurately, with the result that a recognition accuracy of the component U can be improved.

(Other Embodiments of Light Guide Body)

Figure 7:
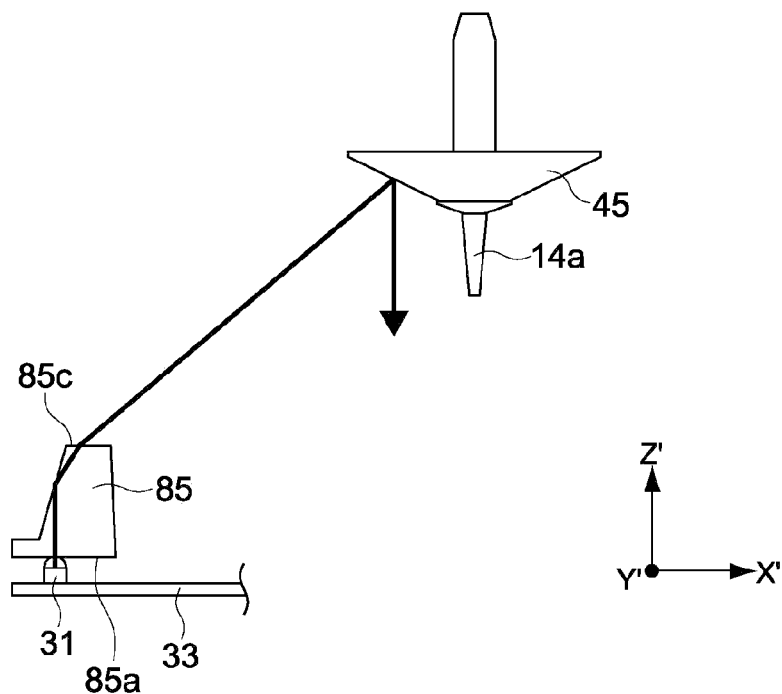
FIG. 7 is a diagram for explaining a light guide body according to another embodiment of the present disclosure.
Figure 8:
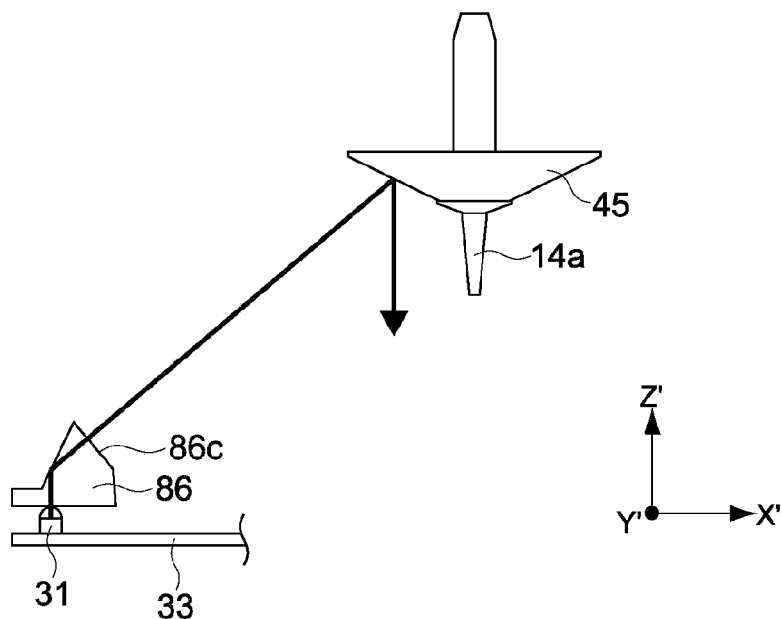
FIG. 8 is a diagram for explaining a light guide body according to still another embodiment of the present disclosure.
Figure 9:
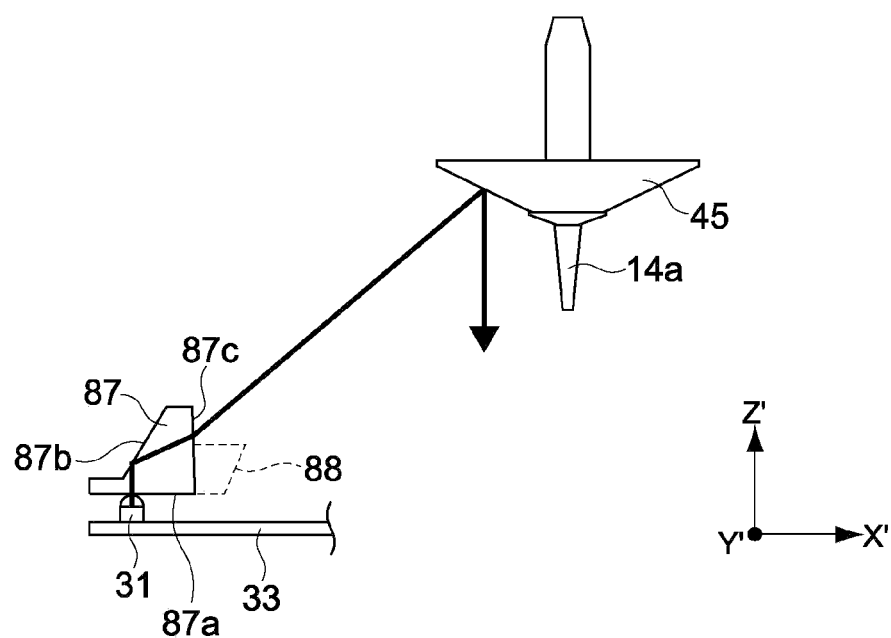
FIG. 9 is a diagram for explaining yet another light guide body.

FIGS. 7 to 9 are diagrams for explaining a light guide body according to other embodiments of the present disclosure. In descriptions below, descriptions on members, functions, and the like that are the same as those of the light irradiation unit 30 and component image pickup unit 40 according to the embodiment described with reference to FIGS. 1, 2, and the like will be omitted, and different points will mainly be described.

Example 1

A light guide body 85 according to an embodiment shown in FIG. 7 includes a light incident surface 85a that the light from the LEDs 31 enters and a light-emitting surface 85c substantially parallel to the light incident surface 85a. Light emitted from the light-emitting surface 85c is reflected by the conic reflective plate 45 at a predetermined angle of, for example, about 50°, and enters a camera (not shown) provided below the conic reflective plate 45. In this example, the shape of the light guide body 85 is simplified as compared to the light guide body 35 described above. However, the height of the light guide body 85 in the direction along the camera optical axis L becomes higher (thicker).

Example 2

A light guide body 86 according to an embodiment shown in FIG. 8 includes a light-emitting surface 86c formed such that an emission angle of light from the light-emitting surface 86c becomes almost a right angle. The thickness of the light guide body 86 in the Z'-axis direction becomes smaller than that of the light guide body 85 shown in FIG. 7. Therefore, by using the light guide body 86, the distance that the sucking nozzle 14a moves vertically can be made shorter than that in the case where the light guide body 85 shown in FIG. 7 is used, with the result that tact is improved.

The light irradiation units according to the examples shown in FIGS. 7 and 8 may be equipped with the LEDs 32 shown in FIG. 2 that have a function as a reflected illumination and a light guide body that guides the light emitted from the LEDs 32 to the component U. In this case, as in the structure shown in FIG. 2, the light guide body only needs to be formed integrally with the light guide bodies 85 and 86 shown in FIGS. 7 and 8.

As in these embodiments, by changing the angles and shapes of the light-emitting surfaces 85c and 86c of the light guide bodies 85 and 86, the irradiation range (light distribution characteristics) of emission light from the light guide bodies can be set as appropriate.

Example 3

A light guide body 87 according to an embodiment shown in FIG. 9 includes a light incident surface 87a that the light from the LEDs 31 enters and a light-emitting surface 87c that is a surface substantially vertical to the light incident surface 87a. In this embodiment, since an angle of a reflective surface 87b with respect to the light incident surface 87a is formed to be smaller than that of the light guide body 86 and an angle of the light-emitting surface 87c with respect to the light incident surface 87a is formed largely, emission light from the light guide body 87 is emitted from a position as low as possible in the Z'-axis direction. With this structure, since the thickness of the light guide body 87 in the Z'-axis direction can be made thin, the distance that the sucking nozzle 14a moves vertically can be shortened as described above, and tact can be improved.

It should be noted that when adding the function of the LEDs 32 of FIG. 2 to the light guide body 87 shown in FIG. 9, a portion 88 indicated by the broken line protruding in the X'-axis direction only needs to be provided in an inner circumferential portion of the light guide body 87. Such a light guide body has the same shape as the light guide body 35 shown in FIG. 2.

(Other Embodiments of Light Irradiation Unit)

Figure 10:
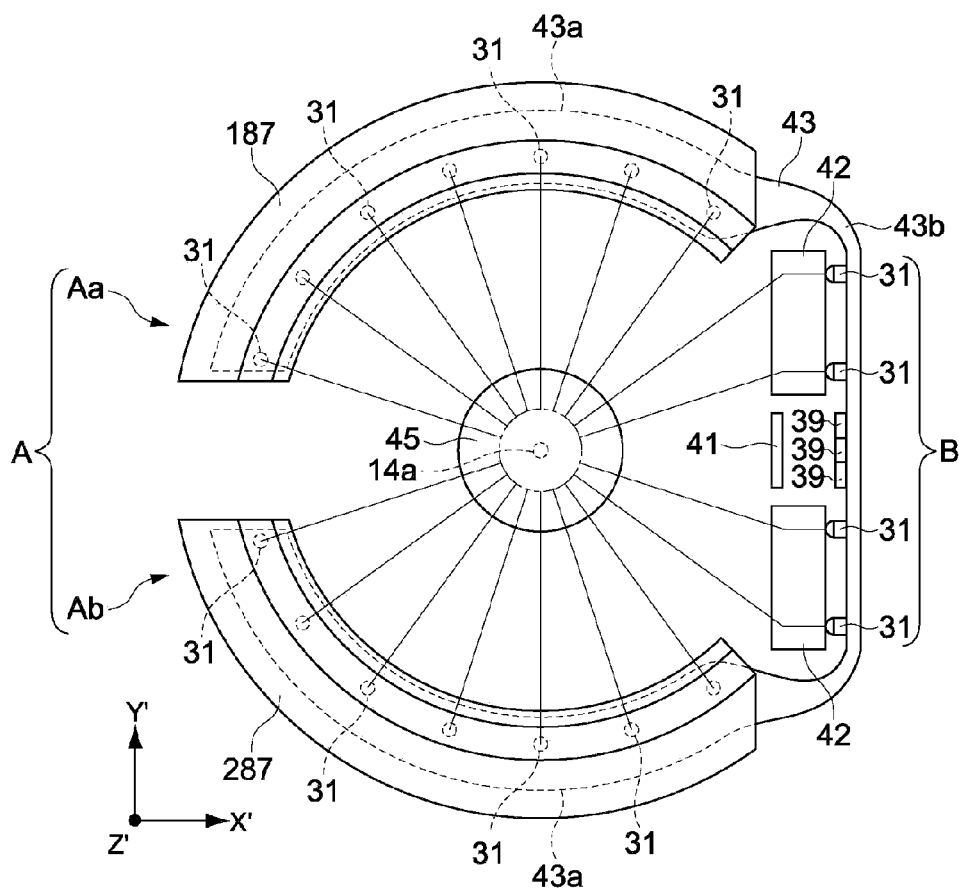
FIG. 10 is a plan view showing a component image pickup unit according to another embodiment of the present disclosure.
Figure 11:
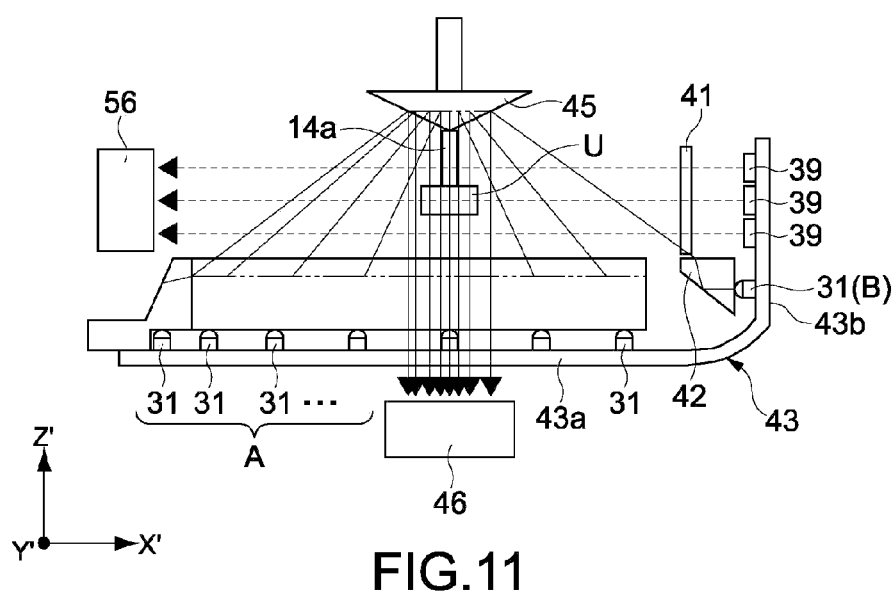
FIG. 11 is a side view (partial cross-sectional diagram) of the component image pickup unit shown in FIG. 10.

FIG. 10 is a plan view showing a component image pickup unit according to another embodiment of the present disclosure. FIG. 11 is a side view (partial cross-sectional diagram) of the component image pickup unit.

The light irradiation unit 30 of this component image pickup unit includes a group A including a plurality of LEDs 31 provided along a part of a circumference, a group B including a plurality of LEDs 31 (third light-emitting devices) provided linearly along the Y'-axis direction, and a flexible print substrate 43 that supports all the LEDs 31. The group A includes two groups Aa and Ab provided symmetrically at an angle of, for example, 90° to 120°. The LEDs 31 of the groups A and B emit light practically having a wavelength range and emits green light, for example.

The flexible print substrate 43 includes first supporting portions 43a that support the LEDs 31 of the group A and a second supporting portion 43b that supports the LEDs 31 of the group B. The second supporting portion 43b is provided like it is bent vertical to the supporting surface of the first supporting portions 43a. Accordingly, the LEDs 31 of the group B emit light having an optical axis in a direction orthogonal to the camera optical axis of the camera 46 along the Z'-axis direction.

Further, the light irradiation unit 30 includes a first light guide body 187 and a second light guide body 287 that have a partial ring shape and arranged so as to correspond to the group A. The first light guide body 187 and the second light guide body 287 are symmetric and have almost the same cross-sectional shape as the light guide body 87 shown in FIG. 9, for example, as shown in FIG. 11. Moreover, the light irradiation unit includes third light guide bodies 42 provided on optical axes between the LEDs 31 of the group B and the conic reflective plate 45. The third light guide body 42 also has the same cross-sectional shape as the light guide body 87 shown in FIG. 9.

The expression "almost the same cross-sectional shape" used herein means refers to a condition that the light guide bodies shown in FIGS. 9 and 11 only need to include a light-incident surface, an internal reflective surface, and a light-emitting surface and the light incident surface 35a and the light-emitting surface 35c only need to satisfy at least the practically-vertical relationship.

Furthermore, the light irradiation unit includes a plurality of LEDs 39 (these may be third light-emitting devices) that emit light having a wavelength range (e.g., blue) different from the wavelength range of the light from the LEDs 31 (e.g., green). The LEDs 39 are supported by the second supporting portion 43b of the flexible print substrate 43 and provided higher than the LEDs 31 of the group B in the Z'-axis direction.

Moreover, the LEDs 39 are provided at a center portion of the second supporting portion 43b in the Y'-axis direction as shown in FIG. 10. The LEDs 39 are also arranged such that optical-axis directions thereof practically match in the X'-axis direction.

Moreover, a diffusion plate 41 that diffuses light is provided on an optical path between the emission light from the LEDs 39 and the component U held by the sucking nozzle 14a. In addition, a second camera 56 is provided on the other side of the position at which the LEDs 39 are arranged with the held component U as a center. The second camera 56 photographs shapes of the components U from the sides using the light from the LEDs 39 as backlight.

As described above, since the light irradiation unit of this embodiment has a shape in which a part of the ring is cut out, an area within an X'-Y' plane can be reduced to thus realize a miniaturization. As a result, it becomes possible to prevent the light irradiation unit from interfering with other members of the component mounting apparatus on which the light irradiation unit is mounted and the mounting substrate W and shorten the distance that the sucking nozzle 14a holding the component U moves vertically as described above.

Moreover, also in this embodiment, the LEDs 31 of the groups A and B and the LEDs 39 can be attached to a single flexible print substrate 43 such that the optical-axis directions thereof match. The second supporting portion 43b only needs to be bent after the LEDs 31 and 39 are attached to the flexible print substrate 43.

(Other Embodiments)

The embodiment of the present disclosure is not limited to the above embodiments, and various other embodiments can also be realized.

The print substrate 33 and the light guide body 35 that are formed continuously in a ring shape have been used in the first embodiment. However, a part of the ring shape of at least one of the print substrate 33 and the light guide body 35 may be cut out.

Although the total reflection has been a condition for the reflection by the first reflective surface 35b of the light guide body 35 in the first embodiment, the reflection is not necessarily limited to the total reflection, and a metal reflective film may be formed as the first reflective surface 35b of the light guide body 35. The same holds true for the light guide bodies of other embodiments.

In the first embodiment, the LEDs 31 and 32 may be supported by different supporting bodies (e.g., substrates) instead of being supported by a single print substrate 33.

The wavelength ranges of the light from the LEDs 31 and 32 have been green and red, respectively. However, the wavelength ranges are not limited thereto and may be blue for the LEDs 31 and infrared light for the LEDs 32, for example.

In the embodiments shown in FIGS. 10 and 11, the LEDs 39 and the diffusion plate 41 do not always need to be provided. Instead, LEDs having the function of the LEDs 32 shown in FIGS. 2 and the like may be provided on the flexible print substrate 43. The light guide body in this case only needs to have the same cross-sectional shape as the light guide body 35 of the embodiment shown in FIG. 2. In this case, it is also possible to not provide the LEDs 32 on the second supporting portion 43b of the flexible print substrate 43 and provide the LEDs 32 on the first supporting portion 43a.

The print substrate 33 shown in FIG. 2 may be a flexible print substrate.

The supporting body supporting the LEDs does not need to be a substrate type and may take a thick solid form. In this case, the LEDs 31 and 32 do not need to be attached on the same plane of the supporting body and may instead be attached at stereoscopic positions. Also in this case, the first and second light guide bodies that respectively guide the light from the LEDs 31 and 32 may be provided separately.

In the descriptions above, the shape of the components U has been a cuboid. However, the shape of the components U may be a sphere (or shape including partial sphere such as hemisphere), a cone, a pyramid, a cylinder, a prism, or a combination of at least two of the above. Even when the components U have those shapes, the side on which the component U is held by the sucking nozzle 14a and the other side can be defined.

The above embodiments have described the example where, as a holding body that holds the components U, the component U is held by the sucking nozzle 14a using vacuum. However, the holding body may hold the components mechanically.

The conic reflective plate 45 has been integrally mounted on the sucking nozzle 14a. However, the conic reflective plate 45 may be provided separate from the sucking nozzle 14a as long as it has a function as a reflective plate that reflects light emitted from the light guide body 35.

The above embodiments have described the example where cannonball-type LEDs 31 and 32 are provided. However, chip-type LEDs practically having a cuboid shape may be provided instead.

The present disclosure contains subject matter related to that disclosed in Japanese Priority Patent Application JP 2010-206505 filed in the Japan Patent Office on Sep. 15, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light irradiation apparatus capable of irradiating, while a component having a first side is held on the first side by a holding body of a component mounting apparatus, light onto a reflective plate to irradiate reflected light from the reflective plate from the first side of the component, the light irradiation apparatus comprising:
    a plurality of first light-emitting devices;
    a supporting body configured to support the plurality of first light-emitting devices such that optical-axis directions of the plurality of first light-emitting devices match; and
    a light guide body configured to guide light emitted from the plurality of first light-emitting devices to the reflective plate so that the reflected light is detected by a detector from a second side of the component on the other side of the first side.

2. The light irradiation apparatus according to claim 1, further comprising
    a plurality of second light-emitting devices supported by the supporting body such that optical-axis directions thereof match,
    wherein the light guide body guides light emitted from the plurality of second light-emitting devices to at least the second side of the component.

3. The light irradiation apparatus according to claim 2,
    wherein the supporting body is a common substrate that supports the plurality of first light-emitting devices and the plurality of second light-emitting devices such that the optical-axis directions of the plurality of first light-emitting devices and the optical-axis directions of the plurality of second light-emitting devices match.

4. The light irradiation apparatus according to claim 3, wherein the light guide body includes
   a light incident surface that the light from the plurality of first light-emitting devices enters,
   a first reflective surface that reflects the light that has entered the light incident surface,
   a light-emitting surface that the light reflected by the first reflective surface exits,
   an internal area through which light passes between the light incident surface and the light-emitting surface, and
   a second reflective surface that is provided on an outer surface of the light guide body and configured to reflect the light from the plurality of second light-emitting devices to guide the reflective light to at least the second side of the component.

5. The light irradiation apparatus according to claim 4, wherein the light from the plurality of first light-emitting devices enters the light guide body to cause a total reflection by the first reflective surface.

6. The light irradiation apparatus according to claim 4, wherein the plurality of first light-emitting devices are arranged along a first circumference,
   wherein the plurality of second light-emitting devices are arranged along a second circumference on an inner side of the first circumference, and
   wherein the light guide body has a ring shape formed along the arrangements of the plurality of first light-emitting devices and the plurality of second light-emitting devices.

7. The light irradiation apparatus according to claim 2, wherein the plurality of first light-emitting devices and the plurality of second light-emitting devices emit light having different wavelength ranges.

8. The light irradiation apparatus according to claim 1, wherein the plurality of first light-emitting devices are arranged along a circumference, and
   wherein the light guide body has a ring shape formed along the arrangement of the plurality of first light-emitting devices.

9. The light irradiation apparatus according to claim 1, wherein the plurality of first light-emitting devices are arranged along a part of a circumference, and
   wherein the light guide body has a partial ring shape formed along the arrangement of the plurality of first light-emitting devices.

10. The light irradiation apparatus according to claim 1, further comprising
    a plurality of third light-emitting devices provided such that optical-axis directions thereof match,
    wherein the plurality of first light-emitting devices are arranged along a part of a circumference,
    wherein the plurality of third light-emitting devices are arranged in an area excluding the part of the circumference, and
    wherein the supporting body is a flexible print substrate including a first supporting portion that supports the plurality of first light-emitting devices and a second supporting portion that is bent from the first supporting portion and supports the plurality of third light-emitting devices.

11. A component image pickup apparatus, comprising:
    a reflective plate;
    a plurality of first light-emitting devices;
    a supporting body configured to support the plurality of first light-emitting devices such that optical-axis directions of the plurality of first light-emitting devices match;
    a light guide body configured to guide, while a component having a first side is held on the first side by a holding body of a component mounting apparatus, light emitted from the plurality of first light-emitting devices to the reflective plate so that the reflected light from the reflective plate is irradiated from the first side of the component held by the holding body; and
    a detector configured to detect the reflected light from the reflective plate from a second side of the component on the other side of the first side.

12. A component mounting apparatus, comprising:
    a holding body configured to hold a component having a first side on the first side;
    a reflective plate;
    a plurality of first light-emitting devices;
    a supporting body configured to support the plurality of first light-emitting devices such that optical-axis directions of the plurality of first light-emitting devices match;
    a light guide body configured to guide light emitted from the plurality of first light-emitting devices to the reflective plate so that the reflected light from the reflective plate is irradiated from the first side of the component held by the holding body; and
    a detector configured to detect the reflected light from the reflective plate from a second side of the component on the other side of the first side.

* * * * *